United States Patent [19]

Murata

[11] Patent Number: 4,935,665
[45] Date of Patent: Jun. 19, 1990

[54] LIGHT EMITTING DIODE LAMP

[75] Inventor: Hroaki Murata, Itami, Japan

[73] Assignee: Mitsubishi Cable Industries Ltd., Amagasaki, Japan

[21] Appl. No.: 267,851

[22] Filed: Nov. 7, 1988

[30] Foreign Application Priority Data

Dec. 24, 1987 [JP] Japan .................. 62-328018
Jun. 6, 1988 [JP] Japan .................. 63-138994
Jun. 6, 1988 [JP] Japan .................. 63-138995
Jun. 10, 1988 [JP] Japan .................. 63-143214
Jul. 7, 1988 [JP] Japan .................. 63-183288

[51] Int. Cl.⁵ ............................ H05B 33/22
[52] U.S. Cl. ............................ 313/500; 313/113
[58] Field of Search ............ 313/113, 498, 499, 500, 313/512; 362/296, 307, 341

[56] References Cited
U.S. PATENT DOCUMENTS 4,168,102  9/1979  Chida et al. .............. 313/500 X
4,603,496  8/1986  Latz et al. ............... 313/500 X
4,628,422 12/1986  Ewald .................... 313/500 X
4,742,432  5/1988  Thillays et al. .......... 313/500 X

FOREIGN PATENT DOCUMENTS 62-149180  7/1987  Japan .
62-279685 12/1987  Japan .

Primary Examiner—Kenneth Wieder
Attorney, Agent, or Firm—Armstrong, Nikaido, Marmelstein, Kubovcik & Murray

[57] ABSTRACT

A light emitting diode lamp comprises an insulated metallic board having a plurality of hollows thereon each of which has a light emitting diode mounted on the bottom thereof and a light-reflecting surface on the side wall thereof. A lens plate collects direct light from the light emitting diode and light reflected by the reflecting surfaces of each of the hollows. The lamp is suited as an automobile lamp, especially as a high mounted stop lamp.

7 Claims, 6 Drawing Sheets

LIGHT EMITTING DIODE LAMP

BACKGROUND OF THE INVENTION

1. Field of the Invention

The present invention relates to a lamp having light emitting diodes as a lighting source, which is suitably used for a variety of automobile lamps, such as a stop lamp, a head lamp, a tail lamp, a turn signal lamp, a parking lamp, and the like, especially for a high mounted stop lamp.

2. Prior Art of the Invention

Heretofore there have been employed exclusively, as automobile lamps, those having a filament as a lighting source. Filament lamps have, however, many drawbacks, such as consuming a lot of electric power, generating great amounts of heat, readily snapping filaments, the lamp per se being large and heavy.

In order to overcome these problems, an idea has been proposed wherein instead of the filament lamp, light emitting diodes are adopted as the lighting source. The proposal may solve the above problems of the filament lamp, because light emitting diodes emit light using a lower voltage and current than those of a filament lamp, and also are small and light, and furthermore seldom include the problem of snapping a wire, thus realizing low electric power consumption, low heat generation, substantially no snapping so the lamp can be used semipermanently, small size, and light weight.

An individual light emitting diode, however, is very low in lighting power to be forwardly emitted because not only is the total lighting power per se rather low, but also it emits light in all directions. The light emitting diode, though being suited as a small indoor illuminator, is required to strengthen its forward lighting power, when it is used for a stop lamp of an automobile. The stop lamp should have such a strong forward lighting power that it is enough to call attention to succeeding vehicles to satisfy the provisions stipulated in D 5500 (automobile lamp) of Japanese Industrial Standard, FMVSS-108 (Federal Motor Vehicle Safety Standard No. 108), or like rules. In a stop lamp of a light emitting diode type already proposed, about 90 to 200 of resin-molded light emitting diodes, each of which includes a small light reflecting cap and a chip of a light emitting diode located thereon, are used and mounted on an insulating board in order to satisfy those standards concerning automobile or vehicle lamps. Those stop lamps are, however, costly, they require time consuming work both in individually molding the light emitting diodes and in assembling them on the insulating board which is accompanied with complicated wiring.

OBJECT OF THE INVENTION

An object of the present invention is to provide a novel lamp having light emitting diodes as a lighting source.

Another object of the present invention is to provide a novel light emitting diode lamp which is ease to produce with low cost and is suitably used for various fields.

Further another object of the present invention is to provide a novel light emitting diode lamp which has an excellent power of illumination to be able to satisfy the provisions stipulated in D 5500 (automobile lamp) of the Japanese Industrial Standard, FMVSS-108, or like rules, and therefore suited as a stop lamp of an automobile.

SUMMARY OF THE INVENTION

These objects of the present invention are achieved by a light emitting diode lamp comprising an insulated metallic board having a plurality of hollows thereon each of which has a light emitting diode mounted on the bottom thereof and a light-reflecting surface on the side wall thereof, and a lens plate which collects direct light from the light emitting diode and light reflected by the reflecting surfaces of the hollows.

DETAILED EXPLANATION OF THE INVENTION

Figure 1:
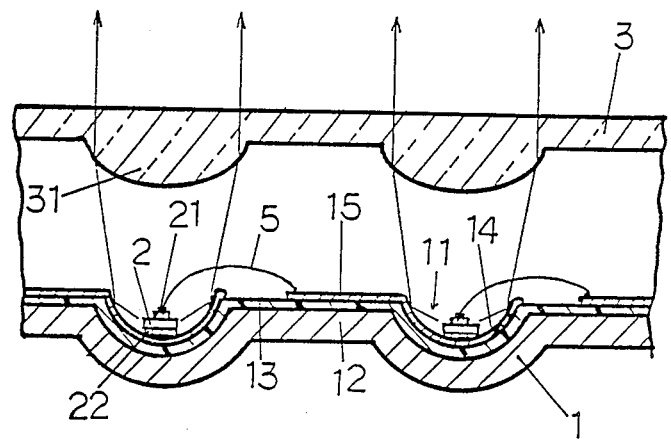
FIG. 1 is a fragmentary sectional view of an embodiment of the present invention.

As described before, conventional light emitting diode lamps have been produced in an inefficient manner, that is, by molding each light emitting diode with a transparent organic resin together with a small light reflecting cap while forming simultaneously a portion of a light collecting lens of the transparent organic resin at the top of the mold, by mounting these resin-molded light emitting diodes on an electrically insulated board, and then by connecting the electric poles of the light emitting diodes to form one electric circuit. On the other hand, in the present invention an insulated metallic board having a plurality of hollows on its surface, and a lens plate are used. The side wall of each hollow functions as a light-reflecting surface. Both the insulated metallic board and the lens plate are simple in structure, and are convenient for mass-production, and therefore the light emitting diode lamp of the present invention may be commercially produced by conventional flow production at low cost using these mass-produced insulated metallic board and lens plate as well as using light emitting diodes which are not resin-molded. Furthermore, in the present lamp a portion of the light emitted from each light emitting diode is directly caught by the lens plate positioned in front of the insulated metallic board, while most of the remaining light emitted from the diode is reflected toward the lens plate by the side wall which functions as a light-reflecting surface, and then all of the light caught by the lens plate is collected by the convex lenses thereof to be sent forward. As a result, high forward lighting may be obtained by the present light emitting diode lamp, and therefore the lamp is especially suited as a high mounted stop lamp of automobiles.

Now the light emitting diode lamp of the present invention is explained in detail relying on drawings. In FIG. 1 to FIG. 18 the same portions are shown with the same numeral or symbol.

In FIG. 1 to FIG. 18, an insulated metallic board 1 has a plurality of hollows 11 on its surface, a light emitting diode 2 is mounted on the bottom of each hollow 11, a lens plate 3 is located in front of the insulated metallic board 1, and a supplementary light-reflecting plate 4 is provided.

Figure 2:
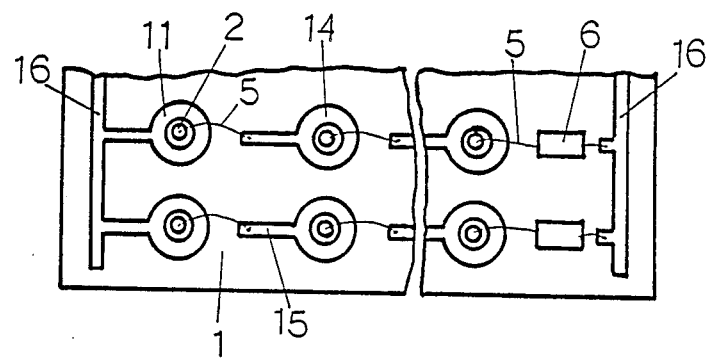
FIG. 2 is a plan view of the insulated metallic board shown in FIG. 1.
Figure 3:
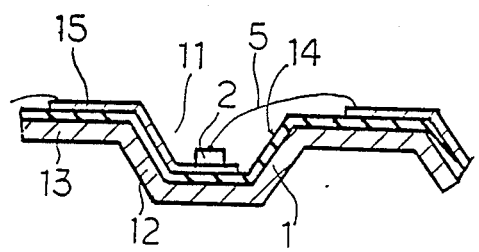
FIG. 3 is a cross-sectional view of another embodiment of the hollow portion formed on the surface of an insulated metallic board.

The insulated metallic board 1 consists of a metallic layer 12 composed of aluminum, copper, iron, stenless steel, nickel and like metal, an electrically insulating layer 13 composed of epoxy resin, epoxy resin reinforced with glass fiber, polyethylene, crosslinked polyethylene, polyimide, polyamideimide, polyester, polyurethane and like electrically insulating materials, and pole pattern 15 and lead pattern 16 made of aluminum, copper, gold, nickel and like electrically conductive metals, and also hollows 11. In the embodiment of FIGS. 1 and 2 the pole pattern 15 covers the side wall 14, as well as the bottom surface, of the hollow 11, and is electrically connected, by using a bonding wire 5, to the head pole 21 of the light emitting diode 2 which is mounted on the bottom of the neighbor hollow 11. The portion of the pole pattern 15 covering the side wall 14 functions as a light-reflecting surface.

The insulated metallic board 1 may be prepared, for example, by using a blank plate of three layers structure composed of a metallic basic layer, an electrically insulating layer, and an electrically conductive metallic layer, by subjecting the electrically conductive metallic layer to etching treatment to picture the pole pattern 15 and lead pattern 16, by plating a metal on the necessary portions of the surfaces of patterns 15 and 16 for wire bonding, thenafter by forming hollows 11.

The hollows 11 may be formed by various methods, such as mechanical digging, drawing, chemical etching, etc. Among them, drawing is most preferable, because a desired number of hollows being substantially uniform in cross-sectional structure and measure may be formed by this method with high efficiency. As well known, drawing means to prepare a cylinder having a bottom without joining from a blank plate, or to form a hollow or hollows having a bottom without joining on the surface of a blank plate. As practical methods of drawing, there are manual hammering a method using a lathe and spatula, a method using a press provided with a punch and a die etc.

The portion of the pole pattern 15 covering the side wall 14 is, if necessary in order to improve its light-reflecting efficiency, burnished by a suitable burnisher such as sand paper, or plated with nickel, chromium, gold, silver or a like glossy metal.

A light emitting diode 2 is mounted on the bottom of hollow 11 of the insulated metallic board 1 in such a manner that the tail pole 22 of the diode 2 is electrically connected to the portion of the pole pattern 15 which covers the bottom of the hollow 11, with an electroconductive adhesive, while the head pole 21 of the diode 2 is connected to the neighbor pole pattern 15 by the bonding wire 5. The lead pattern 16 is connected to the closest diode 2 with interposition of a resistance 6 due to a reason described hereinafter. Then, if necessary, all the surface of the insulated metallic board 1, or at least the hollows 11 and the bonding wires 5 are masked with a suitable transparent material, such as polycarbonate, epoxy resin, silicon resin, and like organic polymers.

The lens plate 3 is made of a suitable transparent material, such as polycarbonate, acryl resin, epoxy resin, polypropylene, nylon, polychlorotrifluoroethylene, ethylenetetrafluoroethylene copolymer, polyvinylidene chloride, fluorinated ethylene-propylene copolymer, polyethylene terephtalate and like organic polymers, and glasses, and has a plurality of convex lenses 31. Each convex lens 31 in the lens plate is located at a position right above the corresponding hollow 11 or especially right above the light emitting diode 2.

Figure 4:
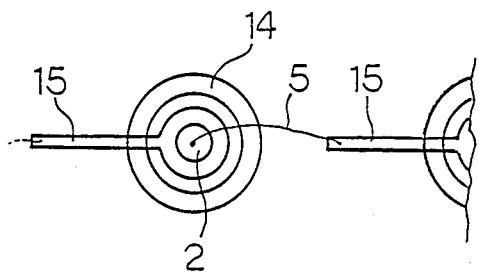
FIG. 4 is a plan view of FIG. 3.

In the embodiment shown in FIG. 1 a portion of light emitted from the light emitting diode 2 is reflected by the surface of the pole pattern 15 on the side wall 14 of the hollow 11 toward the lens plate 3, and then is collected by the convex lenses 31 to be released forward. In the embodiment shown in FIG. 3 and FIG. 4 the electrically insulating layer 13 is composed of a material excellent in transparency and electrical insulation, such as polycarbonate, polymethylmetacrylate, nylon, polypropylene, and the like organic polymers. As a result, the surface per se of the metallic layer 12 at the side wall 14 of the hollow 11 functions as a light-reflector. Therefore in this embodiment as a material of the metallic layer 12, although an ordinary surface finish is employable, it is preferably to use a metal having a clean and glossy surface at least at the side wall 14 to realize good light-reflection. Furthermore in order to make as the light-reflecting area as wide as possible due to the metallic layer 12 at the side wall 14, it is preferable to make the width of the portion of the pole pattern 15 on the side wall 14 as narrow as possible as seen in FIG. 4. The width is, for instance, from about 0.05 to about 0.2 mm where the hollows 11 have a measurement explained hereinafter in detail in FIG. 8.

Figure 5:
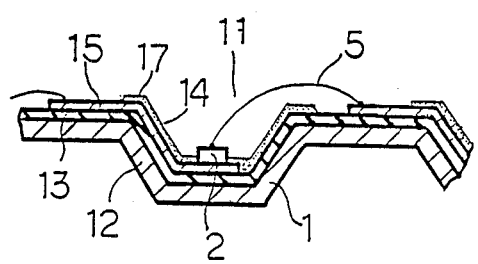
FIG. 5 is a cross-sectional view of another embodiment of the hollow portion formed on the surface of an insulated metallic board.
Figure 6:
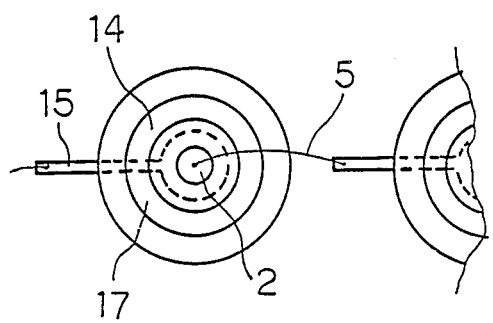
FIG. 6 is a plan view of FIG. 5.

In the embodiment shown in FIG. 5 and FIG. 6 all of the surface of the side wall is covered with a light-reflecting layer 17. The light-reflecting layer 17 may be applied in various ways such as painting a light-reflecting varnish, paint, or a white resist, by vapor-depositing a metal, etc., after forming the pole pattern 15, and the lead pattern 16, or after forming the hollows 11 and mounting the light emitting diodes 2 on the bottom of the hollows 11. This embodiment has the following advantage; that is, as a material of the electrically insulating layer 13, materials of various chemical kinds are used regardless of transparency. Another advantage is an increasing degree of freedom in designing pole pattern 15. In this situation a commercially available polyimide film is also usable, which though rather poor in transparency, is excellent in heat-resistance and electrical breakdown strength, and furthermore is easily adhered to various metallic materials with epoxy-type adhesive and like conventional adhesives. Therefore, the embodiment shown in FIG. 5 and FIG. 6, having excellent heat-resistance and electrical breakdown strength, can be produced easily by using a commercially available polyimide film as a constitutional material of the electrically insulating layer 13.

Figure 7:
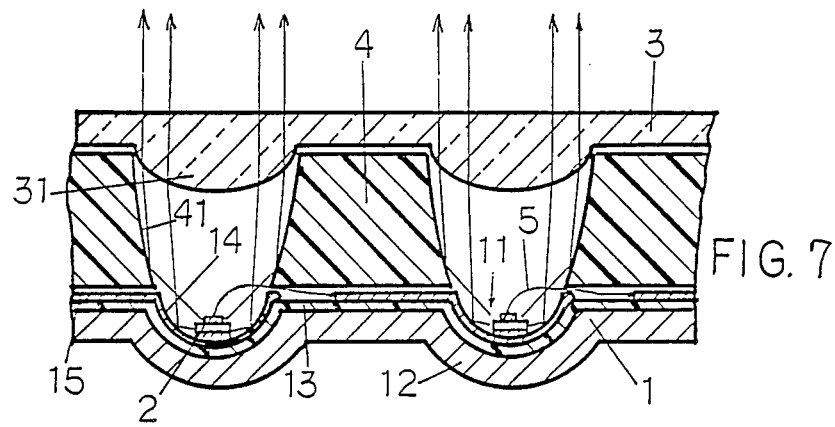
FIG. 7 is a fragmentary sectional view of another embodiment of the present invention.

In embodiment shown in FIG. 7 the supplementary light-reflecting plate 4 is interposed between the insulated metallic board 1 and the lens plate 3. The supplementary light-reflecting plate 4 has through holes whose side walls 41 present parabolic curvature as seen in FIG. 7, and in order to improve light-reflecting efficiency the surface of the parabolic side wall 41 is applied thereon with a suitable glossy layer, such as a metallic plate, a vapor-deposition of a metal, a light-reflecting layer of varnish, paint, etc. Among the light emitted from the light emitting diodes 2, a portion which is not caught by the side wall 14 of the hollow 11 is caught and reflected by the parabolic side walls 41 toward the lens plate 3 to give a stronger lighting. A supplementary light-reflecting plate whose through holes are conical, cylindrical, or another form may also be used instead of the supplementary light-reflecting plate 4.

Figure 8:
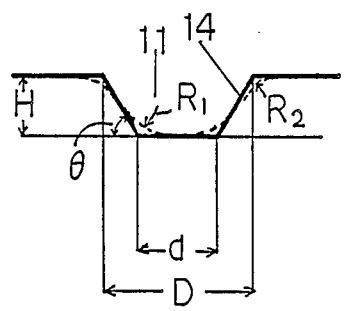
FIG. 8 is a cross-sectional view of a hollow portion formed on the surface of an insulated metallic board to explain the sectional structure and measurements thereof.

In the present invention a reversed trapezoidal hollow 11 having a cross-section as seen in FIG. 8 is preferable, because of easy formation by means of drawing, especially shallow drawing, good light-reflecting efficiency of the side wall 14, and furthermore easy mounting of a light emitting diode 2. The more preferable cross-sectional configuration of the hollow 11 is explained in detail relying on FIG. 8. In FIG. 8, only the outer surface of the side wall 14 and the bottom surface of the hollow are exhibited, whereas the structure inside of the side wall 14 and other parts are not shown because they are unnecessary for the following explanation. In this FIG. symbol d exhibits the bottom radius of the hollow 11, symbol D exhibits the opening radius, symbol H exhibits the depth of the hollow 11 respectively, and symbol $\theta$ shown the inclination angle of the side wall 14. In general the inclination angle $\theta$ is preferably from 30 to 65 degrees. With an inclination angle $\theta$ outside of the above range, efficiency to reflect light toward the lens plate 3 tends to become low. These values d, D, H are varied according to the size of the light emitting diode to be used. In case a light emitting diode such as one which is popular in size, from 0.04 to 0.16 mm$^2$ in surface area, and from 10 to 400 mm in height is used, the value of d is from 0.4 to 1.6 mm, especially from 0.6 to 1.0 mm, the value of D is from 1.0 to 2.6 mm, especially from 1.2 to 1.8 mm, and the value of H is from 0.2 to 0.5 mm, especially from 0.3 to 0.45 mm. When the value d is smaller than 0.4 mm, the value D is smaller than 1.0 mm, or the value H is greater than 0.5 mm, it becomes difficult to form the hollow 11 per se, as well as difficult to mount a light emitting diode. On the other hand, when the value d is greater than 1.0 mm, the value D is greater than 2.0 mm, or the value H is smaller than 0.2 mm, it becomes difficult to collect light efficiently.

When the bottom surface of the hollow 11 is uneven or concave, there may be the following two problems in the commercial production of the present lamp. First, it is difficult to mount a light emitting diode at a desired position on the bottom surface. Second, an inevitable gap occurs between the above uneven or concave bottom surface and the flat tail surface of a light emitting diode to be mounted, and the gap requires an excessive amount of electro-conductive adhesive to adhere both surfaces mutually. However, use of an excessive amount of the adhesive may frequently coat the p-n junction in the side wall of the diode to weaken the light emitted. Therefore the bottom of the hollow 11 is preferable as flat as possible. The gap above mentioned is preferably smaller than 1/5, especially smaller than 1/10 of the length of one side of the light emitting diode to be used.

When the bottom corner or opening edge of the hollow 11 is too sharp an arc as drawn by a solid line in FIG. 8, the electrically insulating layer 13 may frequently peel off the metallic layer 12 or pole pattern 15 by the action of heat which is generated during production, or operation of the present lamp. In order to diminish the problem of peeling, these portions are preferably made slightly round as shown by a dotted line in FIG. 8. The values of the radius $R_1$ at the bottom corner, and the radius $R_z$ at the opening edge are both from about 0.05 to about 0.5 mm, preferably from about 0.05 to about 0.2 mm.

Figure 9:
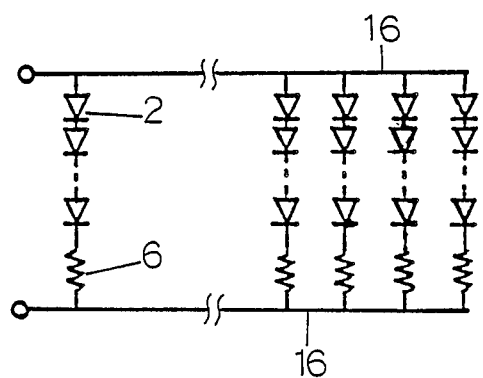
FIG. 9 is an embodiment of electric circuit of the present invention.

In FIG. 9 at least two or more of the light emitting diodes 2 and one resistance 6 are connected in series, and also a plurality of these series lines are connected by means of the lead pattern 16 in parallel. Although the power of light emitted from the diodes 2 is varied by the voltage applied thereto, the resistance 6 can stabilize the power of light from the diodes 2 inspite of the possible fluctation of the voltage applied thereto.

Many kinds of commercially available light emitting diodes may be used in the present invention without any limitation concerning the structure of the diode, color of light emitted, etc. Light emitting diodes emitting desired color light may be selected according to usages. For instance, a red light is suited for a stop lamp of an automobile, a yellow light is for a turn signal lamp, a green light is for a green signal lamp. When desired to use the lamp of the present invention for a stop lamp, especially a high mounted stop lamp of automobile, it is preferable to use as light emitting diodes, for example, those described in the specification of Japanese Pat. Application Sho 61-92895, which have a double hereto structure having a concentration of carriers in the active layer from $10^{15}$ to $10^{20}$ atoms/cm$^3$, especially from $10^{15}$ to $10^{19}$ atoms/cm$^3$ in order to satisfy the provisions stipulated in D 5500 of Japanese Industrial Standard, the FMVSS-108, or like rules. The light emitting diodes described in the above Japanese specification are more preferable for producing the lamp of the present invention, because they can emit stronger light than conventional diodes when ordinary voltage is applied, and therefore are able to be used when a lower voltage is applied, as a result generating less heat than conventional diodes during operation. They are very stable in quality, and may be easily mass-produced at a low cost.

Figure 10:
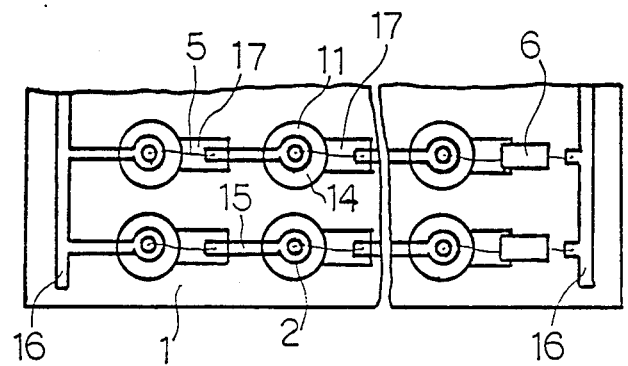
FIG. 10 is a plan view of an insulated metallic board in another embodiment of the present invention.
Figure 11:
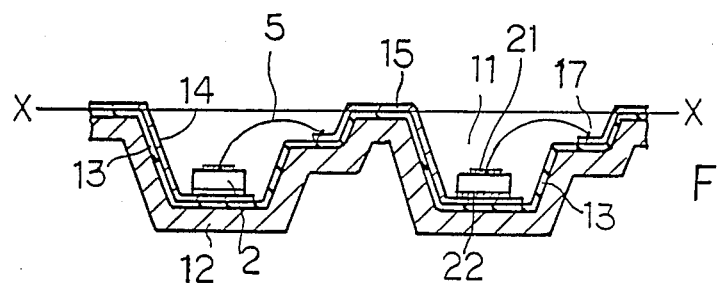
FIG. 11 is a fragmentary sectional view of the insulated metallic board shown in FIG. 10.

In the embodiment shown in FIG. 10 and FIG. 11 the insulated metallic board 1 has two kinds of hollows, that is, the hollows 11 for mounting light emitting diodes 2, and the hollows 17 for accommodating bonding wires 5. The pole pattern 15 covers a part of the side wall 14 and bottom of the hollow 11, and the spearhead thereof extends to the hollow 17 which is linked to the neighbor hollow 11 wherein the neighbor light emitting diode 2 is mounted. Each diode 2 is electrically connected to the neighbor one by means of a bonding wire 5 with interposition of a pole pattern 15. The X—X line in FIG. 11 indicates the surface level of insulated metallic board 1. In this case the bonding wire 5 can be positioned under the surface level (the level of X—X line) of insulated metallic board 1 due to the hollow 17. This embodiment has an advantage mentioned below.

In case hollows 17 are not formed, the bonding wires 5, at least a part thereof, hold inevitably a higher position than the level of insulated metallic board 1 as seen in FIGS. 1–7. In the course of producing the present lamp, are frequently snapped bonding wires 5 due to the wires 5 holding a higher position which are possibly caught by something or caught on fingers of workers. On the other hand, where the hollows 17 are formed and all of the wires 5 are located under the level of the X—X line as seen in FIG. 11, the bonding wires 5 are prevented from catching and therefore prevented from snapping.

The depths of hollows 11 and 17 depend upon the size of the light emitting diodes. When the diode has a surface area from about 0.04 to about 0.16 mm, and from about 10 to about 400 μm in height, the preferable depths of hollows 11 and 17 are about from 0.2 to about 0.05 mm, and about from 0.05 to about 0.2 mm, from the level of the X—X line.

In FIGS. 10 and 11 the insulated metallic board 1 may be prepared, for example, by using a blank plate having a three layer structure composed of a metallic basic layer, an electrically insulating layer, and an electrically conductive metallic layer, subjecting the electrically conductive metallic layer to etching treatment to picture the pole pattern 15 and lead pattern 16, plating a metal for wire bonding, and then forming hollows 11 and hollows 17 by, for example, shallow drawing.

Light emitting diodes 2 are mounted on the bottom of each hollow 11 of the insulated metallic board 1 in such a manner that the tail pole 22 of each diode 2 is electrically connected to the portion of the pole pattern 15 which covers the bottom of the hollow 11, using an electroconductive adhesive, while the head pole 21 of the diode 2 is connected to the neighbor pole pattern 15 by means of a bonding wire 5. Then, if necessary, all the surface of the insulated metallic board 1, or at least hollows 11, 17 and bonding wires 5 are masked with a suitable transparent material.

When hollows 11, 17 are formed by drawing, it is in general preferable to use, as a blank plate of the insulated metallic board 1, a metallic basic layer which is 2 mm or thinner, because of easy drawing. A light emitting diode lamp of the present invention comprising such a thin insulated metallic board 1 includes, however, a possible problem or snapping of the bonding wires 5. The problem may happen when the insulated metallic board 1 is distorted by an external force, such as a force generating through setting the present lamp at a desired position. The above problem may be prevented or diminished in such a manner that at least one side of the insulated metallic board 1 is bent, as seen in the embodiment shown in FIGS. 12–14. The bending strengthens the insulated metallic board 1 against external torsion to protect the bonding wires 5 from snapping.

Figure 12:
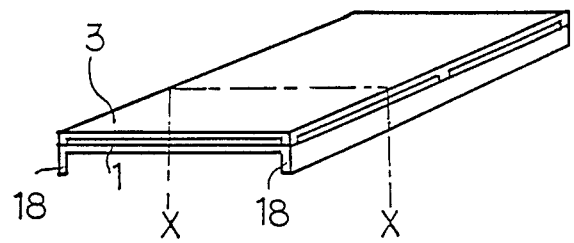
FIG. 12 is a schematic perspective view of another embodiment of the present invention.
Figure 13:
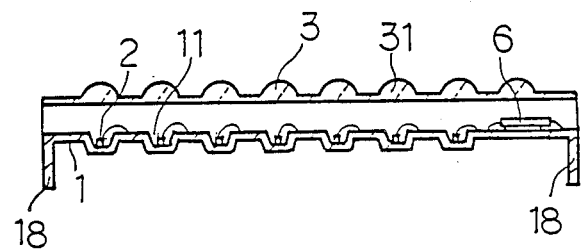
FIG. 13 is a somewhat enlarged sectional view of X-X line portion of FIG. 12.
Figure 14:
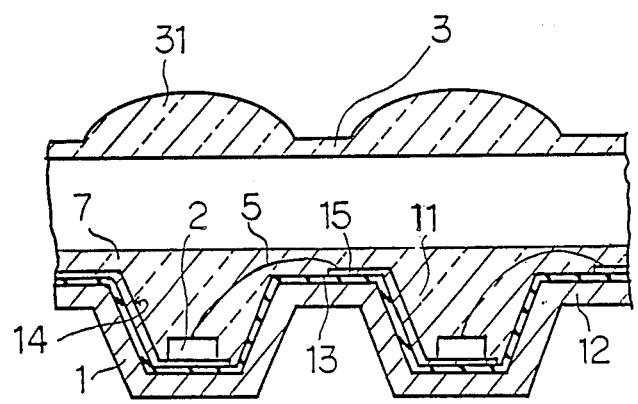
FIG. 14 is a enlarged fragmentary sectional view of FIG. 13.

In the embodiment shown in FIGS. 12–14 an insulated metallic board 1 has a plurality of hollows 11, a bent portion 18 is formed at one side of the insulated metallic board 1, light emitting diodes 2 are mounted on the bottom of the hollows 11, a lens plate 3, bonding wires 5 resistances 6 are provided and, a transparent organic polymer layer 7 masks light emitting diodes 2, hollows 11 and bonding wire 5 en bloc.

In order to make drawing easier for the blank plate of the insulated metallic board 1, it is preferable to use, as a blank plate thereof, a metallic basic layer 12 which are as thin as 0.1 to 1.5 mm. The bent portion 18 may be formed at an desired step in the course of producing the present lamp.

Besides light emitting diodes, resistances for stabilizing the emitting power of the diode, or other non-light emittable electric parts are usually mounted on an insulated metallic board, and therefore such an insulated metallic board does not illuminate the entire surface thereof, because of having an portion whereon non-light emittable electric parts are mounted. This problem, however, may be solved by a manner wherein the insulated metallic board is bent to make, for example, at least two separate surfaces, and the one surface mounts light emitting diodes 2 only and the remaining surface mounts only non-light emittable electric parts, such as resistances, as seen in FIG. 15.

Figure 15:
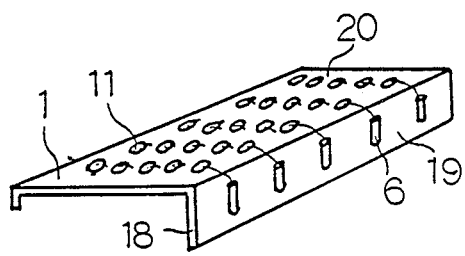
FIG. 15 is a schematic perspective view of another embodiment of the present invention.

In the embodiment of FIG. 15 the resistances 6 are concentrated on the surface 19 of the bent portion 18 which is formed by bending one side of the insulated metallic board 1. As a result, the insulated metallic board 1 is divided into the light emitting surface 20 whereon only the light emitting diodes are mounted and the non-light emitting surface 19 whereon only the resistances 6 are mounted, so that only the surface 20 is used as a lighting face. The embodiment having the bent portion 18 also has the same advantage explained with regard to the embodiment of FIGS. 12–14, that is, being resistant against torsion.

The lens plate 3 in the present invention is a congregation of convex lenses 31, and is so molded that the individual convex lens 31 is located at the position just above a light emitting diode 2 on the insulated metallic board 1. The direct light from the diode 2 and the reflected light from the side wall 14 are caught by means of the convex lenses 31 to release the light forwardly and effectively. When there is a large gap between the central direction of light emitted from the diode 2 and the optical axis of the convex lens 31, it is generally difficult to obtain a desired brightness through the lens plate 3, even though using light emitting diodes 2 having the highest light emitting power. Although the gap is therefore preferably as small as possible, it is not necessarily easy to do in commerical production. However, the following proposal is one solution for the problem.

Figure 16:
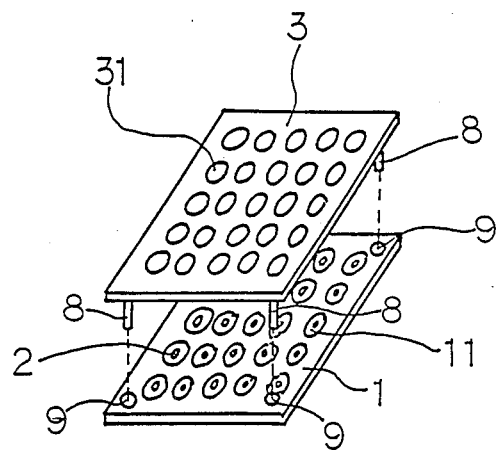
FIG. 16 is an exploded schematic perspective view of a further another embodiment of the present invention.
Figure 17:
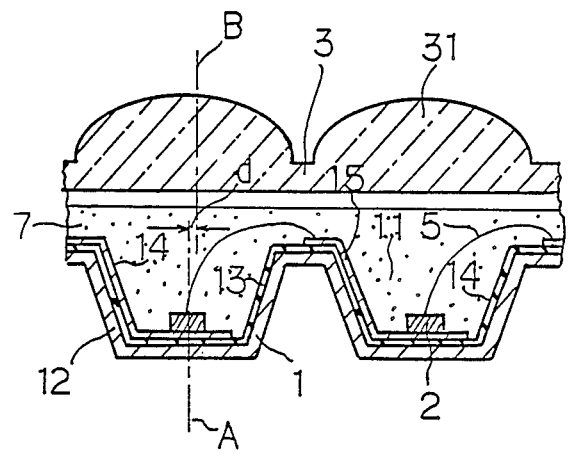
FIG. 17 is a enlarged fragmentary sectional view of the embodiment of FIG. 16 after assembling.

Namely, at least two guide pins are provided on the insulated metallic board 1 and/or the lens plate 3, as seen in FIGS. 16 and 17, and the board 1 and plate 3 are assembled through the guide pins, thus obtaining good coincidence between them in commercial production.

In the embodiment of FIGS. 16 and 17, an insulated metallic board 1 has hollows 11, a lens plate 3, resistances 6, bonding wires 5 are provided and a transparent organic polymer layer 7 masks light emitting diodes 2, hollows 11 and binding wire 5 en bloc, and pole patterns 5 are formed on the insulated metallic board 1. The lens plate 3 is provided with guide pins 8 at the four corners thereof, while the insulated metallic board 1 is provided with guide through holes 9 at the four corners thereof corresponding to the positions of the guide pins 8 of the lens plate 3. The insulated metallic board 1 and the lens plate 3 are mutually assembled by inserting each guide pin 8 into the corresponding guide through hole 9. As a result, the value of a gap G between the central direction A of light emitted from the light emitting diode 2 and the optical axis B of the convex lens 31 is within allowance. Using as a popular light emitting diode one having a surface area of from 0.04 to 0.16 mm² and a height of from 10 to 400 mm, although the value of gap G of 500 μm is in general very large and therefore difficult to obtain a desired lighting, it is easy to decrease the value of gap G to less than 100 μm by the device shown in FIGS. 16 and 17, and as a result a desired brightness may be obtained.

In a modified embodiment of FIGS. 16 and 17 guide pins are attached to a lens plate, and guide through holes are bored on an insulated metallic board. Though the number of guide pins are at least two, preferably all corners, more preferably further other positions, of a lens plate or an insulated metallic board are provided with guide pins, respectively.

Figure 18:
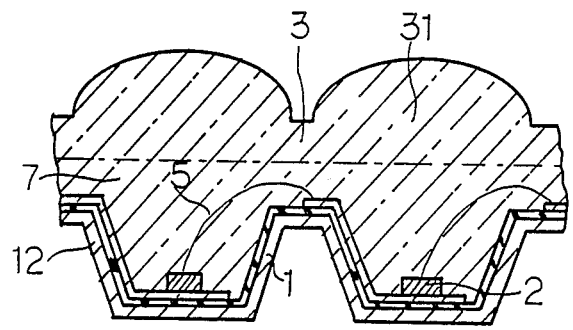
FIG. 18 is a fragmentary sectional view of another embodiment of the present invention.

In the embodiment shown in FIG. 18 a lens plate 3 is formed on an insulated metallic board 1 in such a condition that the lens plate 3 is integrated with a transparent organic polymer layer 7 masking the surface of the board 1. This embodiment may be produced, for example, by pouring the melt of a transparent organic polymer into a mold which forms the integrated body of the lens plate 3 and the layer 7 and is set on the surface of the board 1.

Effect of the invention

As described above, the light emitting diode lamp of the present invention comprises essentially an insulated metallic board mounting thereon light emitting diodes and a lens plate. The insulated metallic board has a structure provided with a plurality of hollows and necessary pole patterns on its surface, and each of the hollows mounts a light emitting diode on its bottom. This structure is very simple and compact, compared with a conventional light emitting diode lamp wherein resin-molded light emitting diodes, each of which includes a light-reflecting cap, are used as a lighting source, mounted on an electrically insulating board, and connected by means of wires. Besides, in the present lamp the side wall of the hollow on the insulated metallic board may function as a light-reflecting face, so that strong forward lighting power may be obtained.

Furthermore, the main parts of the present lamp, that is, chips of light emitting diodes, the insulated metallic board, the lens plate, etc. are all easily mass-produced, and also the main processes for making the present lamp, that is, forming hollows on the insulated metallic board, mounting light emitting diodes on the hollows, wire-bonding, etc. are all possible to do cheaply and safely in flow working, and therefore the lamp of the present invention may be mass-produced at low cost and high quality.

What is claimed is:

1. A light emitting diode lamp comprising:
   an insulated metallic board having a plurality of hollows thereon, each of said hollows has a light emitting diode mounted on a bottom surface thereof and each of said hollows has a light-reflecting surface on a side wall thereof; and
   a lens plate collects direct light from each light emitting diode and collects light reflected by the light-reflecting surfaces of each of the hollows.

2. A light emitting diode lamp as defined in claim 1, wherein the hollows on the insulated metallic board are formed by drawing.

3. A light emitting diode lamp as defined in claim 2, wherein the insulated metallic board has other hollows on its surface, the hollows being formed by drawing and accomodating bonding wires.

4. A light emitting diode lamp as defined in claim 1, wherein at least one side of the insulated metallic board is bent.

5. A light emitting diode lamp as defined in claim 4, wherein the insulated metallic board has at least two surface regions, and a group of light emitting diodes and a group of non-light emittable parts are separately mounted on each surface region, respectively.

6. A light emitting diode lamp as defined in claim 1, wherein the insulated metallic board and/or the lens plate are provided with guide pins and/or guide holes, and the insulated metallic board and lens plate are mutually connected by the guide pins and guide holes.

7. A light emitting diode lamp as defined in claim 1, wherein the lens plate is integrated with a transparent organic polymer layer masking a surface of the insulated metallic board, and said lens plate is formed by a transparent organic polymer, an integrated body of the lens plate and the transparent organic polymer layer is set on a surface of the insulated metallic board.

* * * * *

UNITED STATES PATENT AND TRADEMARK OFFICE
CERTIFICATE OF CORRECTION

PATENT NO. : 4,935,665
DATED : June 19, 1990
INVENTOR(S) : Hiroaki MURATA

It is certified that error appears in the above-identified patent and that said Letters Patent is hereby corrected as shown below:

On the title page, Item [75], "Hroaki Murata" should read --Hiroaki Murata--;

Item [30], "Jul. 7, 1988" should read --Jul. 22, 1988--.

Signed and Sealed this

Seventeenth Day of March, 1992

Attest:

HARRY F. MANBECK, JR.

*Attesting Officer*   *Commissioner of Patents and Trademarks*